(12) United States Patent
Labuschagne et al.

(10) Patent No.: US 8,321,162 B2
(45) Date of Patent: Nov. 27, 2012

(54) MINIMIZING CIRCULATING CURRENT USING TIME-ALIGNED DATA

(75) Inventors: Casper A. Labuschagne, Pullman, WA (US); Normann Fischer, Colfax, WA (US); Satish Samineni, Pullman, WA (US); Armando Guzman-Casillas, Pullman, WA (US)

(73) Assignee: Schweitzer Engineering Laboratories Inc, Pullman, WA (US)

( * ) Notice: Subject to any disclaimer, the term of this patent is extended or adjusted under 35 U.S.C. 154(b) by 391 days.

(21) Appl. No.: 12/695,778

(22) Filed: Jan. 28, 2010

(65) Prior Publication Data

US 2010/0125373 A1      May 20, 2010

Related U.S. Application Data

(63) Continuation-in-part of application No. 12/239,678, filed on Sep. 26, 2008, now Pat. No. 7,856,327.

(60) Provisional application No. 60/978,711, filed on Oct. 9, 2007.

(51) Int. Cl.
G06F 19/00   (2006.01)

(52) U.S. Cl. ......................................................... 702/60

(58) Field of Classification Search .................... 702/60, 702/66, 182–185, 188
See application file for complete search history.

(56) References Cited

U.S. PATENT DOCUMENTS

| | | | |
|---|---|---|---|
| 4,387,336 A | 6/1983 | Joy | |
| 4,829,298 A | 5/1989 | Fernandes | |
| 5,006,846 A | 4/1991 | Granville | |
| 5,224,011 A | 6/1993 | Yalla | |
| 5,271,572 A | 12/1993 | Grandi | |
| 5,315,527 A | 5/1994 | Beckwith | |
| 5,341,265 A | 8/1994 | Westrom | |
| 5,422,561 A | 6/1995 | Williams | |
| 5,446,682 A | 8/1995 | Janke | |
| 5,498,954 A | 3/1996 | Bassett | |
| 5,498,956 A | 3/1996 | Kinney | |
| 5,530,338 A | 6/1996 | Beckwith | |
| 5,541,498 A | 7/1996 | Beckwith | |
| 5,544,064 A | 8/1996 | Beckwith | |
| 5,550,459 A | 8/1996 | Laplace | |
| 5,550,460 A | 8/1996 | Bellin | |
| 5,581,173 A | 12/1996 | Yalla | |
| 5,592,393 A | 1/1997 | Yalla | |
| 5,646,512 A * | 7/1997 | Beckwith | ...................... 323/257 |
| 5,680,324 A | 10/1997 | Schweitzer, III | |
| 5,694,281 A | 12/1997 | Roberts | |
| 5,699,219 A | 12/1997 | Arita | |

(Continued)

OTHER PUBLICATIONS

Casper Labuschagne, Izak Van Der Merwe, A Comparison Between High-Impedance and Low-Impedance Restricted Earth Fault Transformer Protection, Nov. 7, 2007.

(Continued)

*Primary Examiner* — Edward Raymond
(74) *Attorney, Agent, or Firm* — Stoel Rives LLP

(57) ABSTRACT

A power system may comprise two or more transformers operating in parallel. A voltage differential may exist between the transformers, which may create a circulating current in the power system. The system voltage of the power system may be modified by performing a tap change operation on one or more of the transformers. The tap change operation may be configured to minimize the circulating current. The circulating current may be minimized by determining the bias between the transformers using an angular difference between the transformer currents. The angular difference may be calculated using time-aligned measurement data. A tap change operation configured to modify the system voltage, while minimizing circulating current, may be determined using the transformer bias.

29 Claims, 4 Drawing Sheets

U.S. PATENT DOCUMENTS

| | | |
|---|---|---|
| 5,703,745 A | 12/1997 | Roberts |
| 5,731,943 A | 3/1998 | Roberts |
| 5,793,750 A | 8/1998 | Schweitzer, III |
| 5,821,716 A | 10/1998 | Okanik |
| 5,963,404 A | 10/1999 | Guzman-Casillas et al. |
| 6,028,754 A | 2/2000 | Guzman-Casillas |
| 6,236,949 B1 | 5/2001 | Hart |
| 6,265,881 B1 | 7/2001 | Meliopoulos |
| 6,313,614 B1 | 11/2001 | Persson |
| 6,341,055 B1 | 1/2002 | Guzman-Casillas |
| 6,356,421 B1 | 3/2002 | Guzman-Casillas |
| 6,411,865 B1 | 6/2002 | Qin |
| 6,442,010 B1 | 8/2002 | Kasztenny |
| 6,446,682 B1 | 9/2002 | Viken |
| 6,603,298 B2 | 8/2003 | Guzman-Casillas |
| 6,608,742 B2 | 8/2003 | Schweitzer, III |
| 6,662,124 B2 | 12/2003 | Schweitzer, III |
| 6,757,146 B2 | 6/2004 | Benmouyal |
| 6,839,210 B2 | 1/2005 | Roberts |
| 6,845,333 B2 | 1/2005 | Anderson |
| 6,946,753 B2 | 9/2005 | Kernahan |
| 7,027,896 B2 | 4/2006 | Thompson |
| 7,196,884 B2 | 3/2007 | Guzman-Casillas |
| 7,319,576 B2 | 1/2008 | Thompson |
| 7,323,852 B2 | 1/2008 | Hoffman |
| 7,355,369 B2 | 4/2008 | Lavieville |
| 7,425,778 B2 | 9/2008 | Labuschagne |
| 7,463,467 B2 | 12/2008 | Lee |
| 7,480,580 B2 | 1/2009 | Zweigle |
| 7,504,806 B2 | 3/2009 | Labuschagne |
| 7,570,469 B2 | 8/2009 | Guzman-Casillas |
| 7,582,986 B2 | 9/2009 | Folkers |
| 7,595,614 B2 | 9/2009 | Stich |
| 7,630,863 B2 | 12/2009 | Zweigle |
| 7,642,736 B2 | 1/2010 | Genkawa |
| 7,660,088 B2 | 2/2010 | Benmouyal et al. |
| 7,710,693 B2 | 5/2010 | Guzman-Casillas |
| 2004/0027748 A1 | 2/2004 | Kojovic |
| 2004/0059469 A1 | 3/2004 | Hart |
| 2005/0280965 A1 | 12/2005 | Lee |
| 2006/0193099 A1 | 8/2006 | Schweitzer |
| 2006/0224336 A1 | 10/2006 | Petras |
| 2007/0086134 A1 | 4/2007 | Zweigle |
| 2007/0090811 A1 | 4/2007 | Labuschagne |
| 2008/0071482 A1 | 3/2008 | Zweigle |
| 2008/0088466 A1 | 4/2008 | Labuschagne |
| 2008/0281540 A1 | 11/2008 | Zweigle |
| 2009/0085407 A1 | 4/2009 | Venkatasubramanian |
| 2009/0088989 A1 | 4/2009 | Guzman-Casillas |
| 2009/0088990 A1 | 4/2009 | Schweitzer, III |
| 2009/0089608 A1 | 4/2009 | Guzman-Casillas |
| 2009/0091867 A1 | 4/2009 | Guzman-Casillas |
| 2009/0099798 A1 | 4/2009 | Gong |
| 2009/0125158 A1 | 5/2009 | Schweitzer, III |
| 2009/0134854 A1 | 5/2009 | Labuschagne |
| 2009/0231769 A1 | 9/2009 | Fischer |
| 2010/0002348 A1 | 1/2010 | Donolo |
| 2010/0114390 A1 | 5/2010 | Stevenson |

OTHER PUBLICATIONS

Ali Kazemi, Casper Labuschagne, Protecting Power Transformers from Common Adverse Conditions, Sep. 16, 2005.

Armando Guzman, Satish Samineni, Mike Bryson, Protective Relay Synchrophasor Measurements During Fault Conditions, Sep. 20, 2005.

Ken Behrendt, Normann Fischer, Casper Labuschagne, Considerations for Using Harmonic Blocking and Harmonic Restraint Techniques on Transformer Differential Relays, Oct. 19, 2006.

Joe Mooney, Satish Samineni, Distance Relay Response to Transformer Energization: Problems and Solutions, Jan. 31, 2007.

Armando Guzman, Normann Fischer, Casper Labuschagne, Improvements in Transformer Protection and Control, Jan. 29, 2009.

PCT/US2010/059734 Patent Cooperation Treaty, International Search Report and Written Opinion of the International Searching Authority, Feb. 9, 2011.

Terry L. Conrad, Concurrent Technologies Corporation, Distributed State Estimator at U.S. Virgin Islands Water and Power Authority St. Thomas and St. John, NASPI Working Group Meeting, Mar. 7, 2008.

A.P. Sakis Meliopoulos, George J. Cokkinides, Floyd Galvan, Bruce Fardanesh, Georgia Institute of Technology, Entergy Services, Inc and New York Power Authority, Distributed State Estimator-Advances and Demonstration, 2008.

Pserc- Ali Abur and MLADEN Kezunovic, Texas A&M University, Sakis Meliopoulos, Georgia Institute of Technology, Enhanced State Estimation by Advanced Substation Monitoring, Power Systems Engineering Research Center, Nov. 2002.

Saman A. Zonouz and William H. Sanders, Information Trust Institute, Coordinated Science Laboratory, and Electrical and Computer Engineering Department University of Illinois at Urbana-Champaign, A Kalman-based Coordination for Hierarchical State Estimation: Algorithm and Analysis, 2008.

ABB: Improved Power System Performance through Wide Area Monitoring, Protection, and Control, 2004.

ABB, Wide Area Measurement, Monitoring, Protection and Control Industrial IT for Energy System Operation- (2003).

Sasa Jakovljevic, Mladen Kezunovic, Software for Enhanced Monitoring in Integrated Substations, 2003 IEEE Bologna Power Tech Conference, Jun. 23-26, 2003.

Y. Wu, M. Kezunovic, Automatic Simulation of IED Measurements for Substation Data Integration Studies, Power Engineering Society General Meeting, Jun. 12-16, 2005.

Sasa Jakovljevic, Data Collecting and Processing for Substation Integration Enhancement, May 2003.

M. Kezunovic, G. Latisko, Automated Monitoring Functions for Improved Power System Operation and Control, Power Engineering Society General Meeting, Jun. 12-16, 2005.

* cited by examiner

MINIMIZING CIRCULATING CURRENT USING TIME-ALIGNED DATA

CROSS-REFERENCE TO RELATED APPLICATIONS

This Application is a continuation-in-part of U.S. patent application Ser. No. 12/239,678, filed Sep. 26, 2008, now U.S. Pat. No. 7,856,327, and entitled "State and Topology Processor," which claims priority to U.S. Provisional Application No. 60/978,711, entitled "Real Time State and Topology Processor" filed Oct. 9, 2007, both of which are hereby incorporated by reference in their entirety.

TECHNICAL FIELD

This disclosure relates to minimizing circulating current and, in particular, to minimizing circulating current using time-aligned data.

BRIEF DESCRIPTION OF THE DRAWINGS

Additional aspects and advantages will be apparent from the following detailed description of preferred embodiments, which proceeds with reference to the accompanying drawings.

DETAILED DESCRIPTION OF PREFERRED EMBODIMENTS

Power transformers used in electrical power systems typically include multiple taps, which may allow for the dynamic selection of the voltage ratio provided thereby. Changing taps on a power transformer may allow a power engineer to regulate the voltage profile of a power system (e.g., in response to changes in demand on the power system, in response to fault conditions, and so on). For example, a transformer tap change may be performed in order to maintain the system voltage of the power system within predefined bounds (e.g., maintain the system voltage within an upper and lower band).

A power system may include multiple power transformers operating in parallel. The power transformers may be located at the same or different substations, and may be connected via a buses or transmission lines. A voltage differential may exist between two or more of the parallel transformers, which may cause a circulating current to flow therebetween. In some embodiments, the transformer voltage differential may be caused by differences in the transformers (e.g., different winding configurations, turn ratios, tap settings, impedance, etc.), different transformer tap settings, operating conditions in the electrical power system, or the like. The circulating current may adversely affect the performance of the power system (e.g., result in power losses, cause transformer overheating, disrupt power transmission, etc.). The circulating current ($I_{CIRC}$) flowing between two parallel transformers may be expressed as follows:

$$I_{CIRC} = \frac{\Delta V}{Z_T} \quad \text{Eq. 1}$$

In Equation 1, $I_{CIRC}$ represents the circulating current, $\Delta V$ represents the voltage differential between the transformers, and $Z_T$ represents a sum of the transformer impedances.

As discussed above, a tap change operation may be performed in order to, inter alia, maintain the power system voltage within upper and lower band settings. In addition, a tap change operation under the teachings of this disclosure may comprise configuring two or more parallel transformers to maintain system voltage levels at acceptable levels while minimizing circulating current flowing therebetween.

Figure 1A:
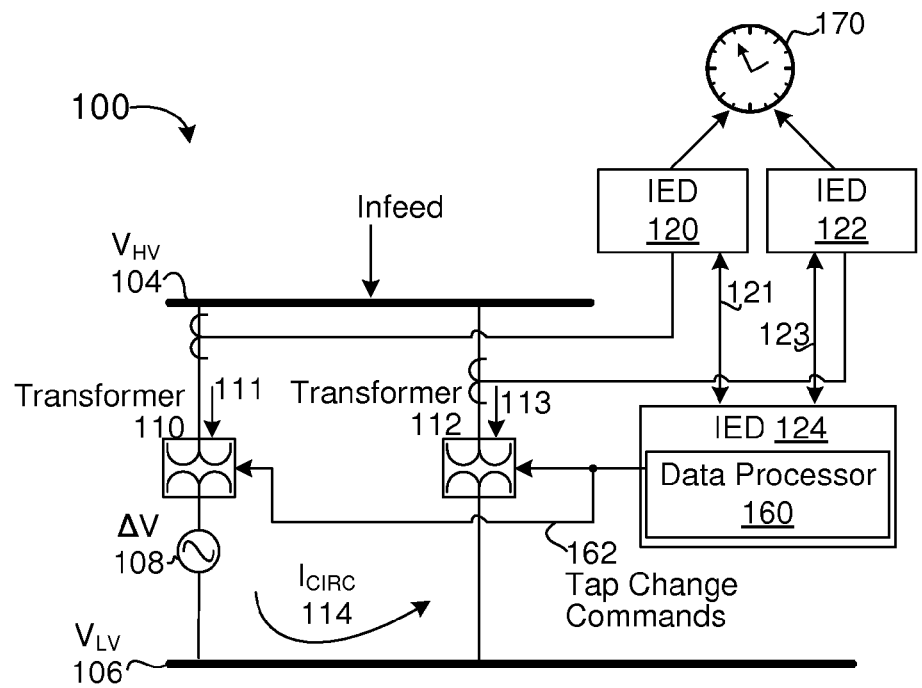
FIG. 1A is a block diagram of one embodiment of an electrical power system configured to minimize circulating current using time-aligned data.

FIG. 1A is a block diagram of one embodiment of a system 100 configured to minimize circulating current using time-aligned data. The system 100 may include a node 104 (e.g., bus, busbar, or transmission line) at a high voltage level $V_{HV}$ and a node 106 at a low voltage level $V_{LV}$. Transformers 110 and 112 may operate in parallel to electrically connect nodes 104 and 106. The transformers 110 and 112 may have different turn ratios, tap settings, impedance levels, or the like. In the FIG. 1A example, the transformer 110 may be operating on a tap setting that causes its turn ratio to be higher than the turn ratio of the transformer 112. Assuming that the transformer with the higher tap setting has the higher voltage, the difference in turn ratios creates a voltage differential $\Delta V$ 108 between the transformers 110 and 112. The voltage differential $\Delta V$ 108 may cause a circulating current $I_{CIRC}$ 114 to flow between the transformers 110 and 112 per Equation 1.

When a tap change operation is performed, the operation may be adapted to minimize the voltage differential $\Delta V$ 108 to thereby minimize the circulating current $I_{CIRC}$ 114. Adapting a tap change operation may comprise selecting which transformer(s) 110 and/or 112 to configure to adjust the system voltage to an appropriate level while minimizing circulating current $I_{CIRC}$ 114. For example, if the transformer 110 is operating at a higher voltage than transformer 112, and the tap change operation requires lowering the system voltage (voltage on node 106), the tap change command 162 may be configured to decrease the tap setting of transformer 110, since this will lower the system voltage and decrease the voltage differential $\Delta V$ 108, whereas, although a tap change to decrease the tap setting of transformer 112 would decrease the system voltage, it will have the negative effect of increasing the voltage differential $\Delta V$ 108 (and hence the circulating current $I_{CIRC}$ 114). Likewise, if the tap change operation requires raising the system voltage, a tap change command 162 configured to increase the tap setting of transformer 112 would increase the system voltage while reducing the voltage differential $\Delta V$ 108 (as opposed to a tap increase on the transformer 110, which would increase the system voltage, but increase the voltage differential $\Delta V$ 108).

It has been observed that the phase angle of the current at the transformer from which the circulating current flows lags the phase angle of the current of the other transformer. Therefore, in the FIG. 1A example in which the voltage differential $\Delta V$ 108 causes a circulating current $I_{CIRC}$ 114 to flow from the transformer 110 to the transformer 112, the phase angle of the current 111 of transformer 110 may lag the phase angle of the current 113 of transformer 112. The angular difference between the currents 111 and 113 may be used to determine the bias between the transformers 110 and 112, which may be used to generate a tap change command adapted to minimize the circulating current $I_{CIRC}$ 114.

The angular difference between the transformers may be calculated as follows:

$$ADIF = \angle I_1 - \angle I_2 \qquad \text{Eq. 2}$$

In Equation 2, ADIF represents the angular difference between the phase angle of the current of a first transformer $\angle_1$ (e.g., angle of current 111) and the phase angle of the current of a second transformer $\angle_2$ (e.g., angle of current 113). If the angle difference (ADIF) is greater than zero, the current phasor of the first current (e.g., current 111) leads the current phasor of the second current (e.g., current 113), and if angle difference is negative, the current phasor of the second current (e.g., current 113) leads the phasor of the first current (e.g., current 111). A tap change command may be generated based on the bias (e.g., phase angle lag/lead) information obtained using Equation 2.

In the FIG. 1A example, an intelligent electronic device (IED) 120 is configured to obtain phasor measurements of the current 111 of the transformer 110, and an IED 122 is configured to obtain phasor measurements of the current 113 of the transformer 112 (e.g., using respective current transformers or other measurement means). As used herein, an IED may refer to any one or combination of a central processing unit (CPU)-based relay and/or protective relay, communication processor, digital fault recorder, phasor measurement unit (PMU), phasor measurement and control unit (PMCU), phasor data concentrator (PDC), relay with phasor measurement capabilities, or any other device capable of monitoring an electrical power system. The current phasor measurements may comprise measurements of a three-phase current (e.g., may comprise measurements of one or more phases of a three-phase current, or a combination of the phases such as, for example, positive-sequence current, negative-sequence current, zero-sequence current, or the like).

The IEDs 120 and 122 may be configured to transmit the current phasor measurements to the IED 124, which may comprise a data processing module 160. As will be discussed below, the data processing module 160 may be configured to time-align the current phasor measurements, calculate an angular difference therebetween, and to generate tap change commands adapted to modify the system voltage while minimizing the circulating current $I_{CIRC}$ 114 flowing in the system 100 using the angular difference. Accordingly, the data processor 160 and/or the IED 124 may be communicatively coupled to the transformers 110 and 112 and may be capable of configuring the transformers 110 and 112 via, inter alia, tap change commands 162.

The current phasor measurements obtained by the IEDs 120 and 122 may be transmitted to the data processor 160 via respective communications channels 121 and 123. The communication channels 121 and 123 may each introduce a communication delay due to, inter alia, the communications protocol implemented on the channels 121 and 123, traffic on the channels 121 and 123, the distance between the IEDs 120 and 122 and the data processor 160, and so on. In some cases, the communication delay of the channels 121 and/or 123 may be variable.

In order to, inter alia, compensate for communication delay, the measurement data transmitted by the IEDs 120 and 122 may include a time stamp and/or be associated with information configured to allow the data processor 160 to time-align the measurements (e.g., time align measurement data received from the IED 120 to measurements received from the IED 122). The IEDs 120 and/or 122 may include time-stamp information associated with the measurements. In some embodiments, the IEDs 120 and 122 may be configured to communicate measurement data as synchrophasors according to the IEEE C37.118-2005 standard. However, the disclosure is not limited in this regard, and any time-alignment technique and/or mechanism known in the art could be used under the teachings of this disclosure. Additional examples of such are disclosed in: U.S. Pat. No. 6,662,124 entitled, "Protective Relay with Synchronized Phasor Measurement Capability for Use in Electric Power Systems," to Schweitzer, III et al.; U.S. Pat. No. 6,845,333 entitled, "Protective Relay with Synchronized Phasor Measurement Capability for Use in Electric Power Systems," to Anderson et al.; and U.S. Application Pub. No. 2007/0086134 entitled, "Apparatus and Method for Estimating Synchronized Phasors at Predetermined Times Referenced to an Absolute Time Standard in an Electrical System" to Zweigle et al., each of which is hereby incorporated by reference in its entirety.

In some embodiments, the IEDs 120 and 122 may be synchronized to a common time reference 170, which may be provided by: a Global Positioning System (GPS); a radio time source, such as the short-wave WWV transmitter operated by the National Institute of Standards and Technology (NIST) at 2.5 MHz, 5 MHz, 10 MHz, 15 MHz, and 20 MHz, or a low frequency transmitter, such as WWVB operated by NIST at 60 Hz; a cesium clock; an atomic clock; an IEEE-1588 time-over-Ethernet system; or the like. Alternatively, or in addition, a common time reference signal may be provided by the communication channels 121 and/or 123 communicatively coupling the IEDs 120, 122, and 124.

Figure 1B:
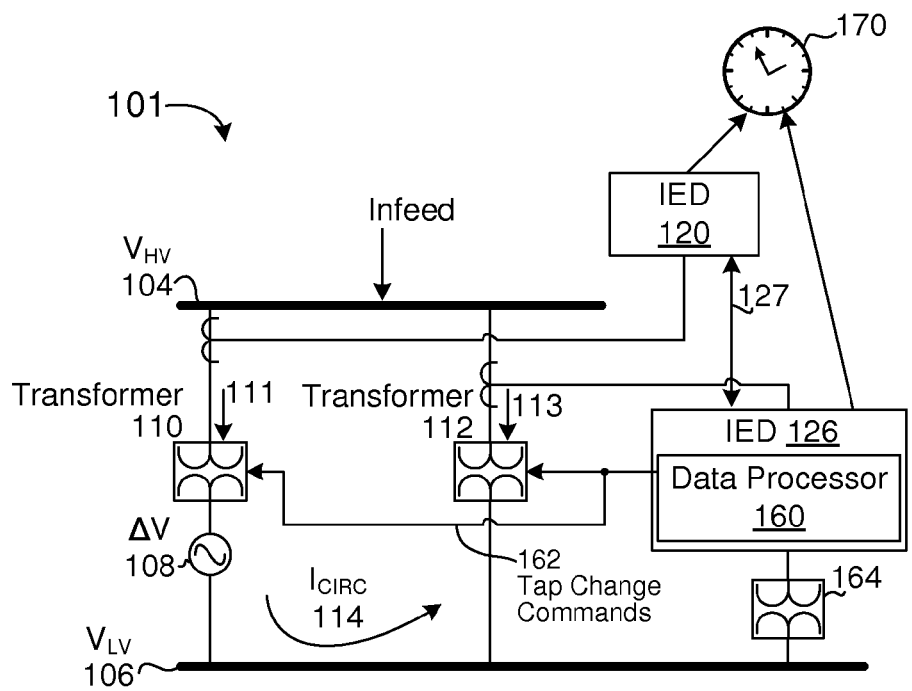
FIG. 1B is a block diagram of another embodiment of an electrical power system configured to minimize circulating current using time-aligned data.

Although FIG. 1A shows the use of three IEDs 120, 122, and 124, the disclosure is not limited in this regard. Other IED configurations and/or communications topologies may be used under the teachings of this disclosure. FIG. 1B shows one example of an alternative topology. In FIG. 1B, the system 101 includes two IEDs 120 and 126. The IED 126 is configured to acquire current phasor measurements of the current 113 of the transformer 112, and to receive phasor current measurements of the current 111 of the transformer 110 from IED 120 (via communications channel 127). The IEDs 120 and 126 may be synchronized to a common time reference 170. Alternatively, or in addition, one of the IEDs 120 or 126 may act as a common time reference to the other IED 120 or 126.

The IED 126 comprises the data processor 160, which, as discussed above, may be configured to use the time-aligned current phasor measurements to generate tap change commands 162 adapted to minimize the circulating current $I_{CIRC}$ 114 flowing in the system 100 while maintaining the system voltage within upper and lower bounds.

The data processor 160 of FIGS. 1A and 1B may be implemented within an IED (e.g., IED 124 or 126). Accordingly, the data processor 160 may be implemented as a stand-alone device and/or in conjunction with a protective relay, PMU, PMCU, or other device. The data processor 160 may be configured to use the phasor measurements of the currents 111 and 113 to calculate the angular difference therebetween (per Equation 2 above). Using the angular difference, the data processor 160 may generate tap change commands 162 configured to maintain the system voltage within predefined bounds, while minimizing the circulating current $I_{CIRC}$ 114. The tap change commands 162 generated by the data processor 160 may be transmitted to the transformers 110 and/or 112 using an IED 124 and/or 126 or another dedicated communications device (not shown).

As shown in FIG. 1B, in some embodiments, the data processor 160 (or IED 126) may be communicatively coupled to node 106 (via a transformer 164 or other measurement device) to receive voltage measurements therefrom. The voltage measurements may be used to monitor the voltage on node 106 to determine when tap change operations are needed to maintain the system voltage within upper and lower bounds (e.g., determine whether the voltage of node 106 needs to be raised or lowered in order to be maintained at acceptable levels). In other embodiments, the voltage measurements may be received from another IED (e.g., IED 120). Alternatively, or in addition, the IED 126 (or data processor 160) may be communicatively coupled to another IED (not shown), such as a protective relay, PMU, PMCU, or the like, which may monitor the system voltage, and instruct the data processor 160 to perform tap change operations to raise or lower the voltage on the node 106 accordingly.

Figure 2:
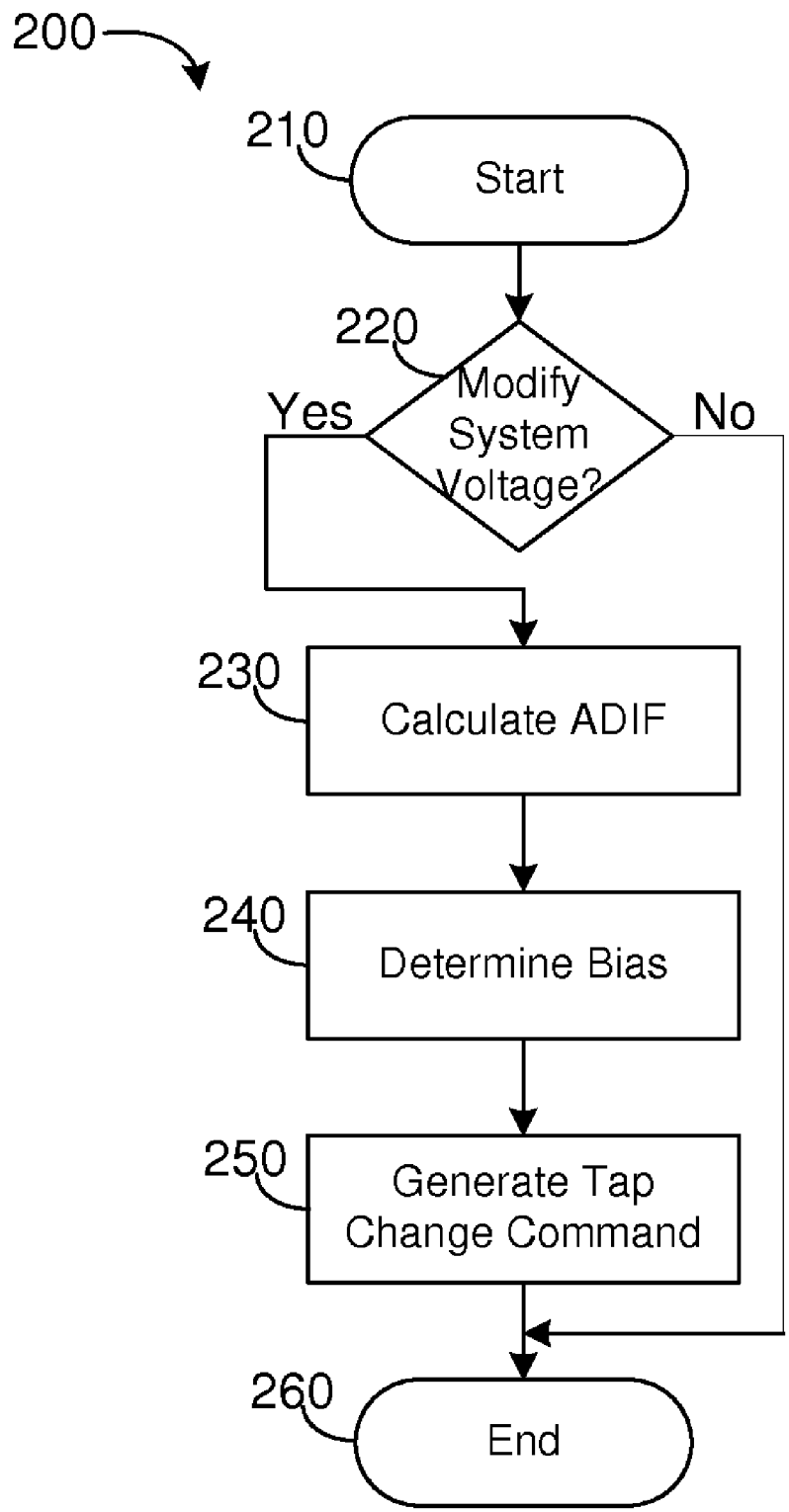
FIG. 2 is a flow diagram of one embodiment of a method for minimizing circulating current using time-aligned data.

FIG. 2 is a flow diagram of one embodiment of a method 200 for performing a tap change operation adapted to minimize circulating current in an electrical power system comprising two or more transformers operating in parallel. The method 200 may be implemented by an IED, such as the IED 120, 122, 124, and/or 126 and/or the data processor 160 of FIGS. 1A and/or 1B.

At step 210, the method 200 may start and be initialized, which may comprise loading one or more computer-readable instructions from a computer-readable storage medium, accessing one or more communications interfaces, accessing one or more measurement devices (e.g., current transformers, IEDs, PMUs, or the like), accessing a common time reference, and so on. The instructions comprising the method 200 may be embodied as one or more discrete software modules stored on a computer-readable storage medium (e.g., disc, optical storage media, file system, network attached storage, or the like). Certain of the instructions and/or steps of the method 200 may be implemented as hardware components, such as digital logic components, analog circuits, or the like. Moreover, one or more of the instructions may be adapted to interface with particular hardware components, such as communications interfaces, measurement devices, or the like. Therefore, one or more of the steps of the method 200 may comprise and/or be tied to particular machine components.

At step 220, the system 200 may determine whether the system voltage needs to be modified (e.g., raised or lowered) in order to maintain the voltage within upper and lower bounds. The determination of step 220 may be made by comparing a system voltage measurement to upper and lower voltage bounds. Alternatively, the method 200 may be communicatively coupled to another device or method, which may be configured to monitor the system voltage. The device or method may cause the method 200 to perform a tap change operation when it determines that a modification of the system voltage is required. If the system voltage is to be modified, the flow may continue to step 230; otherwise, the flow may end at step 260 until the process is initiated upon the next processing interval.

At step 230, an angle difference between currents of the parallel transformers may be determined. The angle difference may be calculated per Equation 2, using time-aligned current phasor measurements obtained at each of the parallel transformers in the electrical power system (e.g., transformers 110 and 112 of FIGS. 1A and 1B). The phasor measurements may be obtained by respective IEDs communicatively coupled to the electrical power system (e.g., via respective current transformers). The IEDs may be positioned at varying distances from one another and/or the computing device implementing the method 200 and may be transmitted using different types of communications channels. Therefore, the measurements may be subject to different, variable communications delays. Accordingly, calculating the angle difference at step 230 may comprise time-aligning the measurements (e.g., using time-stamp data associated therewith, using a common time reference, or the like). The measurement data may comprise synchrophasor measurements according to IEEE C37.118-2005 or another standard.

Calculating the angle difference at step 230 may further comprise applying one or more correction factors to the measurement data (according to a topology of the power system, properties of the measurement device(s) used to acquire the measurements, or the like), filtering the measurements, refining the measurements, applying one or more measurement checks (e.g., a KCL check), and so on.

At step 240, a bias of the transformers may be determined. The bias may be indicative of which transformer lags the other (e.g., which current lags the other). The bias may be determined using the sign of the angle difference as described above.

At step 250, a tap change command may be generated according to the bias determined at step 240. The tap change command may be adapted to modify the system voltage (e.g., raise or lower the system voltage), while minimizing circulating current between the transformers as described above.

Figure 3:
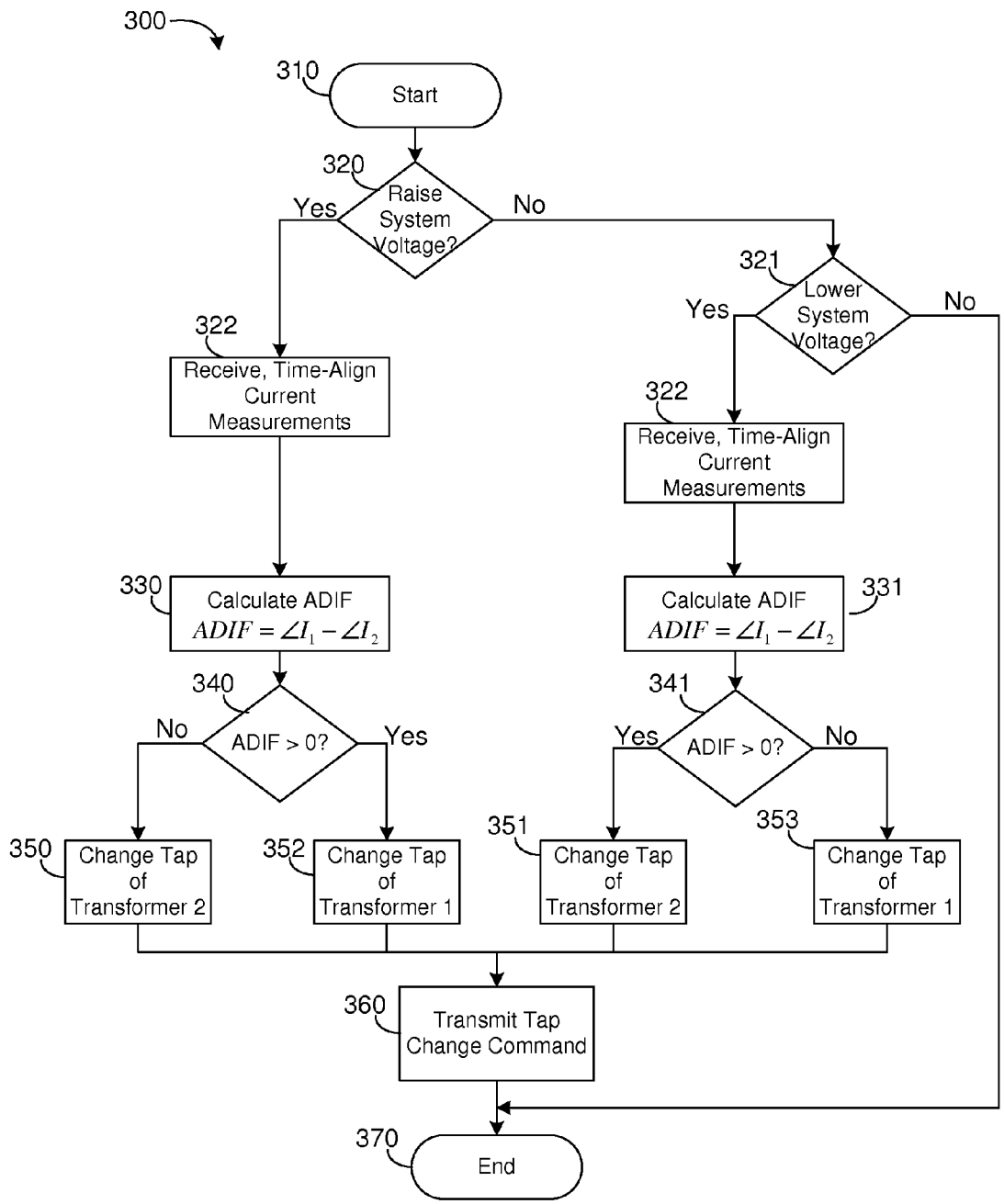
FIG. 3 is a flow diagram of another embodiment of a method for minimizing circulating current using time-aligned data.

FIG. 3 is a flow diagram of another embodiment of a method 300 for performing a tap change operation configured to minimize circulating current between a first transformer and a second transformer operating in parallel. At step 310, the method 300 may be initialized and start as described above in conjunction with FIG. 2.

At step 320, the method 300 may determine whether the system voltage is to be raised in order to be maintained at an acceptable level (e.g., above a lower bound). The determination of step 320 may be made by comparing a voltage level of the system (e.g., voltage level on Node 106 of FIGS. 1A and 1B) to a lower bound. The voltage measurement may be obtained by the method 300, may be obtained by another IED and transmitted to the method 300, or the like. If the determination indicates that the system voltage is to be raised, the flow may continue at step 330; otherwise, the flow may continue to step 321.

At step 321, the method 300 may determine whether the system voltage is to be lowered in order to be maintained at an acceptable level (e.g., lower than an upper bound). The determination of step 320 may be made as described above (e.g., by comparing a voltage level measured in the power system to an upper bound). If at step 321, the voltage level is to be lowered, the flow may continue to step 331; otherwise, the flow may go to the end 370.

In some embodiments, steps 320 and 321 may be implemented by another device or method (e.g., implemented by a protective relay or other monitoring device), which may be configured to provide protective or other monitoring services to the power system, including maintaining the system voltage within upper and lower bounds. The device or method may monitor the system voltage and, upon detecting the system voltage nearing the upper or lower bounds, may cause the method 300 to perform step 330 or 331.

At steps 330 and 331, the angle difference between the first and the second parallel transformers may be calculated as described above in conjunction with FIG. 2 (e.g., per Equation 2).

Calculating the angle difference at steps 330 and 331 may comprise receiving and time-aligning current phasor measurements of the first and the second transformers at step 322. The current phasor measurements may have been acquired by respective IEDs, a first IED to measure a current of the first transformer (e.g., using a first current transformer), and a second IED to measure a current of the second transformer (e.g., using a second current transformer). The phasor measurements acquired by the first and the second IEDs may be transmitted to the method 300 using a communication channel. The IEDs may be configured to include time-alignment information with the measurements, such as time-stamp information. In some embodiments, the measurements may comprise synchrophasors per the IEEE C37.118-2005 standard. Alternatively, or in addition, the measurements may include time-alignment information in another form (e.g., include a time stamp with each measurement, include a time offset parameter, tie the measurements to a common time reference, or the like). In some embodiments, the IEDs and/or the method 300 may be communicatively coupled to a common time reference (e.g., GPS time, radio, etc.), to which the measurements may be synchronized. Alternatively, or in addition, the communications channel through which the measurements are transmitted to the method 300 may provide for time synchronization (e.g., may time-stamp messages, etc.).

At step 322, the current phasor measurements may be time aligned to one another. The time alignment may allow for the angle difference to be calculated correctly. In addition, at step 322 (or steps 330 and 331), the current phasor measurements may be corrected (for differences in measuring devices, orientation, etc.), filtered, verified (e.g., using a KCL or other check), and/or refined as described above. The time-aligned current phasor measurements may then be supplied to steps 330 and/or 331 where the angle difference may be calculated as described above.

Following the calculating of the angle difference at step 330 (using the time-aligned phasor measurements), the flow may continue to step 340, where the bias between the first and the second transformers may be determined (e.g., the direction of the circulating current (if any) may be determined). If, at step 340, angle difference is not greater than zero, the flow may continue to step 350; otherwise, if angle difference is greater than zero, the flow may continue to step 352.

At step 350, a tap change command may be generated to modify the tap setting of the second transformer to generate a higher voltage, which is typically done by configuring the transformer to use a higher tap setting. Accordingly, at step 350, a tap change command to increase the tap setting of the second transformer may be generated.

At step 352, a tap change command may be generated to modify the tap setting of the first transformer to generate a higher voltage. As described above, this generally comprises a command to cause the first transformer to use a higher tap setting.

Although not depicted in FIG. 3, in some embodiments, when the angle difference is zero (indicating that there is only nominal circulating current between the first and the second transformers), the tap change command may be generated to minimize the voltage differential between the transformers. Accordingly, the transformer having a tap setting that most closely approximates the target voltage level may be selected. The selection may be based on the granularity of the tap settings of the transformers, the positions of the tap settings, or the like.

Following the generation of the tap change command at step 350 or 352, the flow may continue to step 360. At step 360, a tap change command may be transmitted to the first or the second transformer. In some embodiments, the transmission of the tap change command may be performed by another device or process (e.g., an IED, protective relay, PMCU, or the like), which may be configured to communicate with and/or control the first and the second transformers.

Alternatively, or in addition, the tap change command may be transmitted by the method 300. After the tap change command is generated and/or transmitted, the flow may end at step 370. Alternatively, at step 370, the program sequence may start again at the next processing interval. In addition, the method 300 may continue receiving current measurements from the first and the second transformers at step 322, calculating the angle difference and bias, and the like so as to be able to respond quickly to a tap change request.

Referring back to step 331, in which the system voltage is to be lowered, after angle difference is calculated at step 341 (using the time-aligned current measurements acquired at step 322), the flow continues to step 341.

At step 341, the method 300 determines the bias between the first and the second transformers using the angle difference and generates a tap change command adapted to lower the system voltage while minimizing circulating current. If the angle difference is greater than zero, the flow may continue to step 351, where the second transformer may be configured to generate a lower voltage. Since lowering the transformer tap setting typically lowers the transformer voltage, the tap change command generated at step 351 may be configured to cause the second transformer to use a lower tap setting. If the angle difference is not greater than zero, the flow may continue to step 353, where a tap change command may be generated to configure the first transformer to generate a lower voltage (e.g., the first transformer may be configured to use a lower tap setting).

Following step 351 or 353, the flow may continue to steps 360 and 370, where the tap change command generated at step 351 or 353 may be transmitted to the first or the second transformer, and the method 300 may end as described above.

Figure 4:
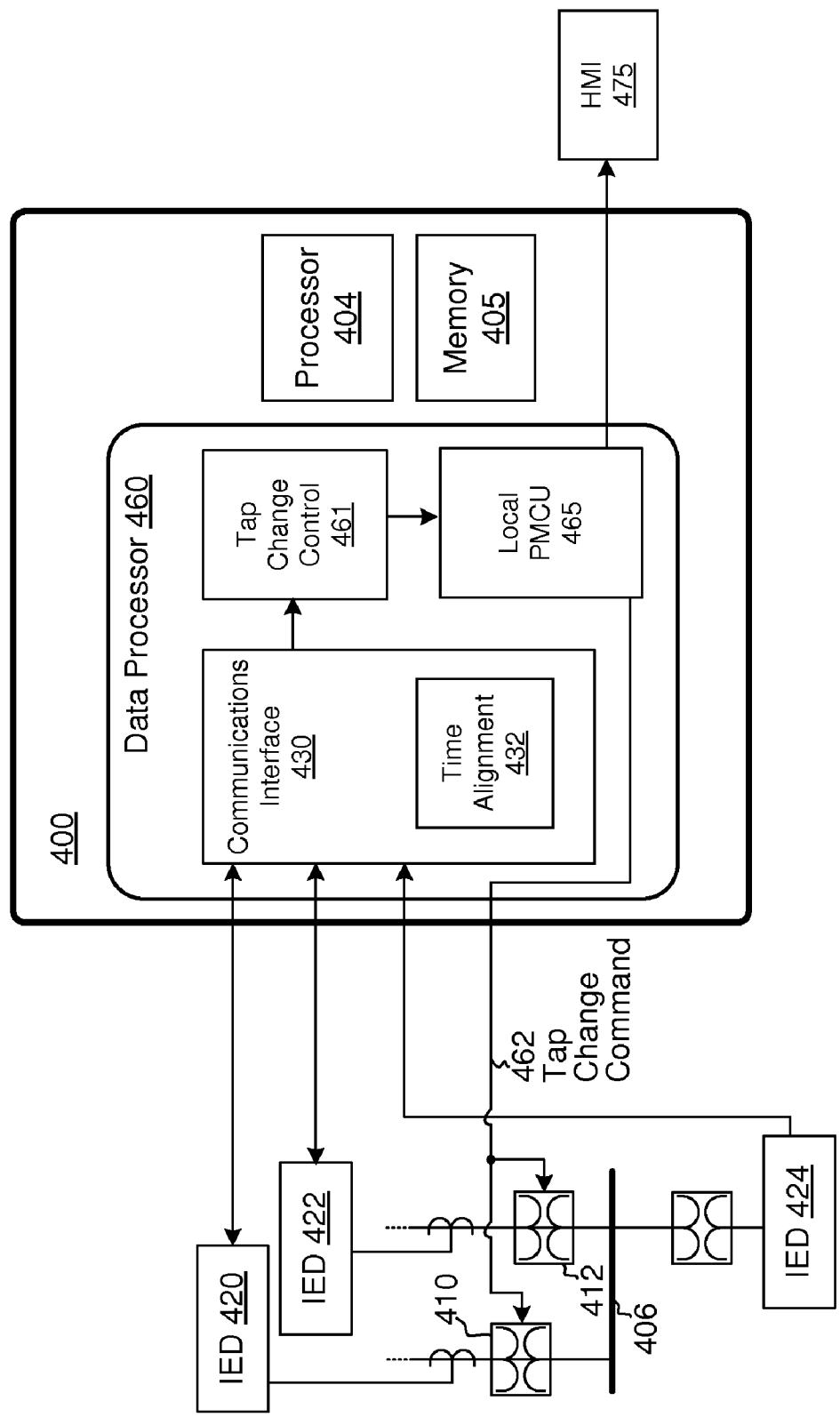
FIG. 4 is a block diagram of a device for minimizing circulating current using time-aligned data.

FIG. 4 depicts one embodiment of a device configured to minimize circulating current between a first and a second transformer operating in parallel.

The device 400 of FIG. 4 may comprise a computing device, such as the IED 124 of FIG. 1A or the IED 126 of FIG. 1B. The device 400 may include a processor 404 and memory 405. The processor 404 may comprise any number of general and/or special purpose processors. The memory 405 may comprise volatile and/or non-volatile memory, computer-readable storage media, and the like. The device 400 may include a data processor 460, which may be implemented on the processor 404 using, inter alia, one or more computer-readable instructions stored on a computer-readable media (e.g., provided by the memory 405).

The device 400 may be communicatively coupled to a first IED 420 and a second IED 422 via a communications interface 430 to receive current phasor measurements therefrom. The current phasor measurements from the first IED 420 may correspond to the current of the first transformer 410, and the measurements from the second IED 422 may correspond to the current of the second transformer 412. The communications interface 430 may be configured to communicate with the IEDs 420 and 422 using any number of different communications protocols, including, but not limited to: IEEE C37.118-2005, IEEE 1344, BPA PDCStream, IEC 61850, OPC-DA/OPC-HAD, Internet Protocol (IP), Transmission Control Protocol (TCP), TPC/IP, User Datagram Protocol (UDP), or the like. The current phasor measurements transmitted to the device 400 by the IEDs 420 and 422 may include time-alignment information (e.g., time stamps with the measurements, as part of the communications channels' communication protocol and/or infrastructure, or the like). In some embodiments, the measurements may comprise synchrophasors (e.g. per IEEE C37.118-2005).

The current phasor measurements from the IEDs 420 and 422 may be time-aligned to one another by a time alignment module 432. The time-alignment may be performed using time-alignment information associated with the measurements, using a time-alignment system provided by the communications channel, according to IEEE C37.118-2005, using a buffer, or the like. In some embodiments, the IEDs 420 and 422 may be synchronized to a common time reference (not shown), such as the common time reference 170 described above in conjunction with FIGS. 1A and 1B. In addition to the time alignment, the device 400 may be configured to apply correction factors (e.g., according to a topology of the power system, properties of the measurement devices, or the like), filter, validate (e.g., using measurement checks), and/or refine the current phasor measurements.

The time-aligned current phasor measurements may flow to a tap change control module 461, which may be configured to generate tap change commands adapted to modify system voltage levels while minimizing circulating current between the first and the second transformers 410 and 412 as described above (e.g., by calculating an angle difference between the currents of the transformers 410 and 412, determining a bias therebetween (based on the sign of the angle difference), and selecting an appropriate tap change accordingly).

In some embodiments, the device 400 may perform tap change operations responsive to a tap change command received from an external device (not shown), such as a protective relay, PMCU, or the like. The tap change commands may be received via the communications interface 430, and may be transmitted to the device 400 responsive to the external device detecting the system voltage falling below a lower voltage bound or exceeding an upper voltage bound.

Alternatively, or in addition, the device 400 may be configured to determine when tap change operations are needed (e.g., by comparing a system voltage to predefined upper and lower voltage bounds). In the FIG. 4 example, the device 400 receives system voltage measurements from an IED 424, which is communicatively coupled (via a voltage transformer) to a power system node 406. The voltage measurements may include time-alignment information (e.g., time-stamp information), which may be used to time-align the voltage measurements to the current phasor measurements received from the IEDs 420 and 422. Alternatively, the voltage measurements may not be time-aligned to the current phasor measurements. The voltage measurements (time-aligned or otherwise) may flow to the tap change control module 461, which may determine whether a tap change operation to raise or lower the system voltage should be performed. As described above in conjunction with FIG. 3, the tap change control module 461 may compare the voltage measurements to the upper and lower bounds and, if the system voltage is to be raised, determine the angle difference between the first and second transformers 410 and 412, and change the tap of the transformer 410 and/or 412 to raise the system voltage accordingly. If the system voltage is to be lowered, the tap change control module 461 may calculate the angle difference and change the tap of the transformer 410 and/or 412 to lower the system voltage accordingly. The tap change selection may be based upon the angle difference, such that circulating current between the transformers 410 and 412 is minimized. For example, if the system voltage is to be raised, and the angle difference is less than zero, the system voltage is raised using the transformer 412 (e.g., by raising the tap of the transformer 412); otherwise, the system voltage is raised using transformer 410. If the system voltage is to be lowered, and the angle difference greater than zero, the system voltage is lowered using transformer 412 (e.g., by lowering the tap of transformer 412); otherwise, the system voltage is lowered using transformer 410.

After determining the tap change operation to perform (based on the angle difference and bias determined using the time-aligned current phasor measurements), a tap change command 462 is generated. In some embodiments, the tap change command 462 may be transmitted to one of the transformers 410 or 412 by a local PMCU 465 and/or using the communications interface 430. Alternatively, or in addition, the tap change command 462 may be generated and/or transmitted by another module and/or device (not shown), such as another IED, protective relay, PMCU, or the like.

The operation of the device 400 may be managed using a human-machine-interface 475. HMI 475 may include a display, input/output devices, and the like. Through HMI 475, a human operator may configure various parameters of the device 400, such as the upper and lower bounds of the system voltage, sensitivity thresholds, communications protocols, system configuration, topology information, correction factors, and the like.

The above description provides numerous specific details for a thorough understanding of the embodiments described herein. However, those of skill in the art will recognize that one or more of the specific details may be omitted, or other methods, components, or materials may be used. In some cases, operations are not shown or described in detail.

Furthermore, the described features, operations, or characteristics may be combined in any suitable manner in one or more embodiments. It will also be readily understood that the order of the steps or actions of the methods described in connection with the embodiments disclosed may be changed as would be apparent to those skilled in the art. Thus, any order in the drawings or Detailed Description is for illustrative purposes only and is not meant to imply a required order, unless specified to require an order.

Embodiments may include various steps, which may be embodied in machine-executable instructions to be executed by a general-purpose or special-purpose computer (or other electronic device). Alternatively, the steps may be performed by hardware components that include specific logic for performing the steps, or by a combination of hardware, software, and/or firmware.

Embodiments may also be provided as a computer program product including a computer-readable medium having stored instructions thereon that may be used to program a computer (or other electronic device) to perform processes described herein. The computer-readable medium may include, but is not limited to: hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic instructions.

As used herein, a software module or component may include any type of computer instruction or computer executable code located within a memory device and/or computer-readable storage medium. A software module may, for instance, comprise one or more physical or logical blocks of computer instructions, which may be organized as a routine, program, object, component, data structure, etc., that perform one or more tasks or implements particular abstract data types.

In certain embodiments, a particular software module may comprise disparate instructions stored in different locations of a memory device, which together implement the described functionality of the module. Indeed, a module may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules may be located in local and/or remote memory storage devices. In addition, data being tied or rendered together in a database record may be resident in the same memory device, or across several memory devices, and may be linked together in fields of a record in a database across a network.

It will be understood by those having skill in the art that many changes may be made to the details of the above-described embodiments without departing from the underlying principles of the disclosure.

We claim:

1. A device for performing a tap change operation in an electrical power system comprising a first transformer and a second transformer operating in parallel, the tap change operation to modify a system voltage of the electrical power system, the device comprising:
   a processor;
   a communications interface configured to receive a first current phasor measurement of a current of the first transformer; and
   a tap change control module operable on the processor and in communication with the communications interface, the tap change control module configured to:
   time align the first and the second current phasor measurements;
   determine an angle difference between the first current phasor measurement and a second current phasor measurement of a current of the second transformer, wherein the angle difference is calculated using the time-aligned measurements; and to
   generate a tap change command based upon the angle difference, the tap change command configured to modify the system voltage.

2. The device of claim 1, wherein the tap change command is configured to cause one of the first and the second transformers to modify a tap setting thereof.

3. The device of claim 1, wherein the first and the second current phasor measurements comprise respective time stamps.

4. The device of claim 1, wherein the first current phasor measurement is a synchrophasor.

5. The device of claim 1, wherein the tap change control module is configured to raise the system voltage, wherein the angle difference is calculated by subtracting an angle of the second current phasor measurement from an angle of the first current phasor measurement, and
   wherein when the angle difference is greater than zero, the tap change command is configured to cause the first transformer to raise the system voltage, and when the angle difference is not greater than zero, the tap change command is configured to cause the second transformer to raise the system voltage.

6. The device of claim 5, wherein the tap change command is configured to increase a tap setting of the first transformer.

7. The device of claim 1, wherein the tap change control module is configured to lower the system voltage, wherein the angle difference is calculated by subtracting an angle of the second current phasor measurement from an angle of the first current phasor measurement, and
   wherein when the angle difference is greater than zero, the tap change command is configured to cause the second transformer to lower the system voltage, and wherein when the angle difference is not greater than zero, the tap change command is configured to cause the first transformer to lower the system voltage.

8. The device of claim 7, wherein the tap change command is configured to decrease a tap setting of the second transformer.

9. The device of claim 1, wherein the communications interface is configured to transmit a tap change command generated by the tap change control module to one of the first transformer and the second transformer.

10. The device of claim 1, wherein the device receives measurements of the system voltage, and wherein the tap change control module is configured to generate a tap change command based on the system voltage measurements.

11. The device of claim 10, wherein the tap change control module is configured to generate a tap change command configured to raise the system voltage when the measurements of the system voltage fall below a lower bound.

12. The device of claim 10, wherein the tap change control module is configured to generate a tap change command configured to lower the system voltage when the measurements of the system voltage exceed an upper bound.

13. The device of claim 1, wherein the first transformer and the second transformer are located within a single substation.

14. The device of claim 1, wherein the first transformer and the second transformer are located in separate substations.

15. A method for performing a tap change operation configured to modify a system voltage and minimize circulating current in an electrical power system, the electrical power system comprising a first transformer and a second transformer operating in parallel, the method comprising:
   receiving first current phasor measurements of a current of the first transformer, the first current phasor measurements acquired by a first current transformer;
   receiving second current phasor measurements of a current of the second transformer, the second current phasor measurements acquired by a second current transformer;
   time aligning the first and the second current phasor measurements;
   calculating an angle difference between the time-aligned first and second current phasor measurements; and
   generating a tap change command based on the angle difference, the tap change command configured to cause one of the first and the second transformers to modify the system voltage by changing a tap setting thereof.

16. The method of claim 15, further comprising transmitting the tap change command to one of the first and the second transformers.

17. The method of claim 15, wherein the first current phasor measurements comprise synchrophasors.

18. The method of claim 15, wherein the first and the second phasor measurements are associated with time-stamp information, and wherein the first and the second phasor measurements are time aligned using the time-stamp information.

19. The method of claim 15, further comprising:
   receiving measurements of the system voltage;
   generating a tap change command configured to lower the system voltage when the system voltage measurements exceed an upper bound; and
   generating a tap change command configured to raise the system voltage, when the system voltage measurements fall below a lower bound.

20. The method of claim 15, wherein the tap change command is configured to raise the system voltage, wherein the angle difference is calculated by subtracting an angle of the second current phasor measurements from an angle of the first current phasor measurements, and wherein generating the tap change command comprises:

when the angle difference is greater than zero, configuring the tap change command to cause the first transformer to increase the system voltage; and when the angle difference is not greater than zero, configuring the tap change command to cause the second transformer to increase the system voltage.

21. The method of claim 20, wherein the tap change command is configured to increase a tap setting of the first transformer.

22. The method of claim 15, wherein the tap change command is configured to lower the system voltage, wherein the angle difference is calculated by subtracting an angle of the second current phasor measurements from an angle of the first current phasor measurements, and wherein generating the tap change command comprises:

when the angle difference is greater than zero, configuring the tap change command to cause the second transformer to lower the system voltage;

when the angle difference is not greater than zero, configuring the tap change command to cause the first transformer to lower the system voltage.

23. The method of claim 22, wherein the tap change command is configured to lower a tap setting of the second transformer.

24. The method of claim 15, wherein the first transformer and the second transformer are located within a single substation.

25. The method of claim 15, wherein the first transformer and the second transformer are located in separate substations.

26. A system for performing a tap change operation configured to modify a system voltage of an electrical power system comprising a first transformer and a second transformer operating in parallel, the system comprising:

a first intelligent electronic device (IED) configured to acquire current phasor measurements of a current of the first transformer;

a second IED configured to acquire current phasor measurements of a current of the second transformer; and a data processor configured to receive the first and the second current phasor measurements, to time-align the first and the second current phasor measurements, and to calculate an angle difference therebetween by subtracting an angle of the second current phasor measurements from an angle of the first current phasor measurements, wherein to raise the system voltage, the data processor is configured to generate a tap change control command configured to cause the first transformer to increase the system voltage when the angle difference is greater than zero, and to generate a tap change control command configured to cause the second transformer to increase the system voltage when the angle difference is not greater than zero, and wherein to lower the system voltage, the data processor is configured to generate a tap change control command configured to cause the second transformer to lower the system voltage when the angle difference is greater than zero, and to generate a tap change control command configured to cause the first transformer to lower the system voltage when the angle difference is not greater than zero.

27. The system of claim 26, wherein the first and the second current phasor measurements are associated with time-stamp information, and wherein the first and the second current phasor measurements are time aligned using the time-stamp information.

28. The system of claim 26, wherein the first and second current phasor measurements comprise synchrophasors.

29. The system of claim 26, further comprising a communications interface configured to transmit a tap change command generated by the data processor to one of the first and the second transformers.

* * * * *